United States Patent [19]

Kumada et al.

[11] Patent Number: 4,543,441
[45] Date of Patent: Sep. 24, 1985

[54] SOLAR BATTERY USING AMORPHOUS SILICON

[75] Inventors: Masaharu Kumada; Hideo Tanabe; Katsuo Yuhara; Akira Misumi, all of Mobara; Hiroshi Kawasaki, Chiba, all of Japan

[73] Assignee: Hitachi, Ltd., Tokyo, Japan

[21] Appl. No.: 579,597

[22] Filed: Feb. 13, 1984

[30] Foreign Application Priority Data

Feb. 14, 1983 [JP] Japan .................. 58-21495

[51] Int. Cl.$^4$ .............................................. H01L 31/06
[52] U.S. Cl. .................................... 136/249; 136/244; 136/251; 136/256; 136/258; 357/30
[58] Field of Search ............... 136/244, 245, 251, 256, 136/258 AM, 249 MS; 357/30

[56] References Cited

FOREIGN PATENT DOCUMENTS

| 57-143874 | 9/1982 | Japan | 136/258 AM |
| 58-92281 | 6/1983 | Japan | 136/258 AM |
| 58-98985 | 6/1983 | Japan | 136/258 AM |
| 2117971A | 10/1983 | United Kingdom | 136/258 AM |

Primary Examiner—Aaron Weisstuch
Attorney, Agent, or Firm—Antonelli, Terry & Wands

[57] ABSTRACT

A solar battery has a pair of opposed light incident transparent electroconductive and back electrodes sandwiching amorphous silicon layers formed on a substrate with at least a major surface of the back electrode surface being in contact with an organic resin layer and being made of a compound of a transition metal and silicon, a compound of a transition metal and nitrogen, or a compound of a transition metal and carbon. Excellent corrosion resistance of the back electrode is obtained and the battery has high performance and high reliability.

15 Claims, 4 Drawing Figures

SOLAR BATTERY USING AMORPHOUS SILICON

BACKGROUND OF THE INVENTION

This invention relates to a solar battery using amorphous silicon. More particularly, this invention relates to an amorphous silicon solar battery characterized by having an electrode of special structure placed opposite to an electrode passing incident light (hereinafter referred to as "a transparent electroconductive electrode") via amorphous silicon layers (hereinafter said electrode being referred to as "a back electrode").

Growing interest has been shown lately towards solar batteries as a new energy source, and especially great hopes are placed on solar batteries using amorphous silicon. This is based on the facts that solar energy is pollution-free and inexhaustible, and that while the conventional solar batteries such as those using single-crystal silicon were very costly and also limited in their use to specific applications, the amorphous silicon solar battery is considered capable of realizing a drastic cost reduction.

The output voltage of one amorphous silicon solar cell is usually below 1 V, but in practical applications of such devices, it is in many cases required that their output voltage (per unit) be higher than 1 V. For this, it is necessary to connect a plurality of solar cells in series to form a battery. From the standpoint of low-cost production, it is an essential requirement that a required number of these solar cells can be formed in regular succession on the same substate. For connecting a plurality of solar cells in series on the same substrate, it is necessary that the individual cells be electrically isolated from each other. For this purpose, the substrate itself must be an insulator, or in case the substrate is conductive, an insulating film must be formed on its surface.

In order to meet such requirements, a proposal has been made in which a film made of a heat-resistant high-molecular polyimide resin or a metal film having a heat-resistant resin layer on its surface is used as the substrate of an amorphous silicon solar battery. However, the amorphous silicon solar battery of such construction is generally poor in reliability and also involves quality problems, especially in moisture resistance. Because the organic resin used for the electrical insulation in such an amorphous silicon solar battery is permeable to moisture, the back electrode, which is usually made of stainless steel, Al, Cr, Ni-Cr alloy, Mo or the like, is oxidized in prolonged use or when left unused for a long time, causing corrosion of the electrode with resultant degradation of its conductive quality and even peeling of the electrode. Naturally, the output of the solar battery is greatly reduced.

SUMMARY OF THE INVENTION

An object of this invention is to eliminate the technical problems of the prior art such as mentioned above and to provide an amorphous silicon solar battery which is improved in corrosion resistance of the back electrode to inhibit or minimize the output reduction of the solar battery in use.

This invention provides a solar battery comprising a substrate and formed thereon a pair of electrodes sandwiching amorphous silicon layers, characterized in that at least a major surface of a back electrode which is placed opposite to a transparent electroconductive electrode passing incident light, with the major surface being in contact with an organic resin layer, is made of at least one compound selected from the group consisting of a compound of a transition metal or metals and silicon, a compound of a transition metal or metals and nitrogen, and a compound of a transition metal or metals and carbon.

DESCRIPTION OF THE PREFERRED EMBODIMENTS

Figure 3:
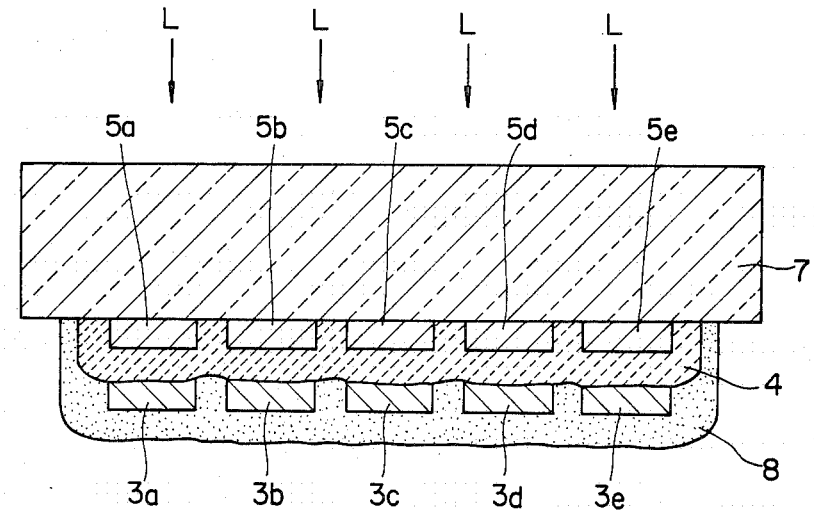
FIG. 3 is a sectional view showing another embodiment of amorphous silicon solar battery according to this invention.
Figure 4:
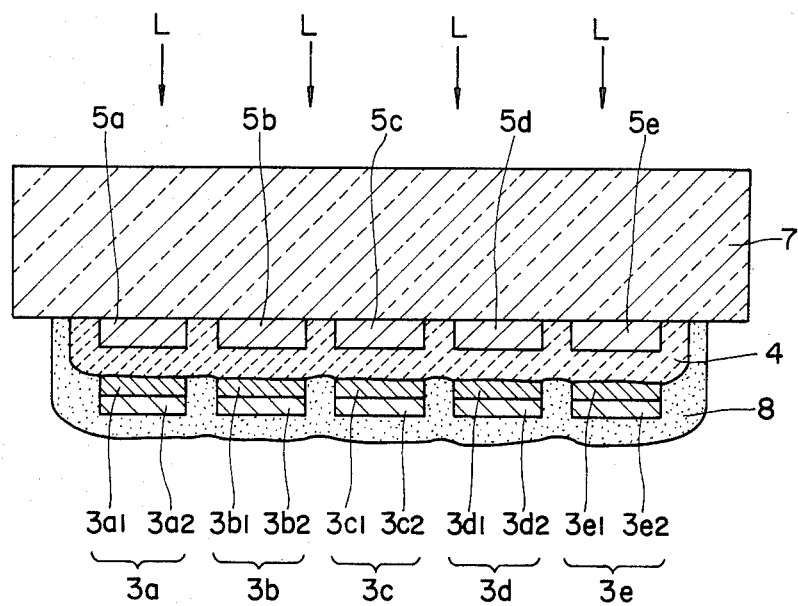
FIG. 4 is a sectional view showing still another embodiment of amorphous silicon solar battery according to this invention.

This invention is characterized by the use of specific materials for the back electrode placed in contact with an organic resin layer. The solar battery provided according to this invention is divided into two structurally different types: a type in which the incident light passes through a $SiO_2$ film and then a transparent electrode as shown in FIG. 2 and another type in which the incident light passes through a transparent substrate and then a transparent electrode, as shown in FIGS. 3 and 4.

Figure 2:
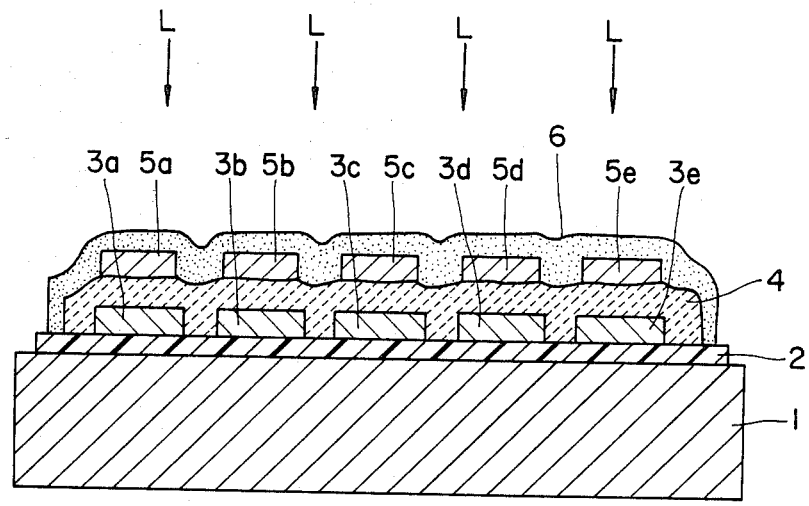
FIG. 2 is a sectional view taken along the line II—II of FIG. 1.

In the type shown in FIG. 2, the incident light, such as sunlight, enters through a $SiO_2$ film 6 and transparent electrodes 5a–5e. In FIG. 2, numeral 4 designates amorphous silicon layers, 3a–3e back electrodes, 2 a heat-resistant resin layer, and 1 a substrate.

In this type of solar battery, a metal plate, preferably a flexible metal plate is used as the substrate, as it is not required to have light transmissivity. Such a metal plate may be made of Fe, Ni, Ni-Cr alloy, Fe-Ni alloy, Fe-Ni-Cr alloy or the like. The metal substrate is preferably prepared in a film-like form so that it can be continuously rolled up for economy of production cost. The thickness of the substrate is usually from 10 to 500 $\mu$m.

When using a metal plate as the substrate, it is necessary to cover the substrate with a heat-resistant resin layer to electrically insulate the solar cells from the substrate because a plurality of solar cells are connected in series on the substrate to increase the output voltage.

As the heat-resistant resin, there may be used polyimide resin, polyamide-imide resin, polyimide isoindoloquinazolinedione (PIQ resin) or the like. The thickness of the heat-resistant resin layer is usually from 2 to 20 $\mu$m.

The heat-resistant resin layer can be formed on the substrate by a conventional method such as dipping or roll coating.

Instead of a metal plate having a heat-resistant resin layer on its surface, it is possible to use a flexible plate made of the heat-resistant resin.

On the heat-resistant resin layer are formed the back electrodes, amorphous silicon layers, and transparent electrodes, and a $SiO_2$ film 6 is formed overlying them for the purposes of passivation and prevention of light reflection.

At least a major surface of the back electrode, which is in contact with the heat-resistant resin layer, must be made of at least one member selected from the group consisting of a compound of a transition metal or metals and silicon (Mt-Si), a compound of a transition metal or metals and nitrogen (Mt-N), and a compound of a transition metal or metals and carbon (Mt-C). Of course, the back electrode may be formed, in its entirety, from the compound (Mt-Si, Mt-N or Mt-C) of a transition metal and Si, N, or C, but it may have a laminate structure comprising a layer of the compound and a layer of a conventionally used metal such as Al, Fe, Ni, Cr, Mo, W, Ti, Co, Ta, Ag, Pt, or an alloy containing one of the metals as a major component in order to lower series resistance of the batteries. Such laminate structure is illustrated in FIG. 4. Needless to say, the back electrode of the type shown in FIGS. 1 and 2 can also have such a laminate structure. In this case, the thickness of the back electrode as a whole is usually in the range of 1,000 to 5,000 Å, and at least a thickness of 200Å from the surface contacting the organic resin layer should be made of at least one compound selected from Mt-Si, Mt-N and Mt-C.

In the case of using an Mt-Si compound, the transition metal (Mt) in such a compound can be at least one member selected from the group consisting of Ti, Zr, Hf, V, Nb, Ta, Cr, Mo, W, Fe, Re, Co, Ni, Pt, and Pd, among which Ti, Zr, Hf, Ta, Mo, and W are preferred, and Ti, Zr, and Hf are most preferred. It is also possible to use a metal compound such as $MO_{1-x}W_xSi_2$ ($1>x>0$). Also, for instance, $TiSi_2$ is preferred to $MoSi_2$ because of less scatter of output characteristics. The amount of Si in the Mt-Si compound used for the back electrode is preferably in the range from 20 to 80% by mole, more preferably from 50 to 80% by mole, most preferably from 60 to 70% by mole.

In the case of an Mt-N compound, Ti, Zr, Hf, V, Nb, Ta, Mo, and W can be favorably used as the transition metal (Mt). The preferred amount of N is such a Mt-N compound is in the range from 5 to 60% by mole, more preferably from 20 to 55% by mole.

In an Mt-C compound, Ti, Zr, Hf, V, Nb, Ta, Mo, and W can preferably be used as the transition metal (Mt). The amount of C in such Mt-C compound is preferably in the range from 5 to 70% by mole, more preferably from 30 to 60% by mole.

A conventionally used method such as sputtering, reactive evaporation, plasma CVD, etc., can be employed for forming the back electrode from these Mt-Si, Mt-N, and Mt-C compounds.

On this back electrode are formed amorphous silicon layers which generate electrons and/or holes that provide electricity generation upon incidence of light.

The amorphous silicon layers consist of a P type layer, an intrinsic (I type) layer and an N type layer. These three layers, made from $SiH_4+B_2H_6$, $SiH_4$, and $SiH_4+PH_3$, respectively, can be formed by a conventional method such as plasma CVD or glow discharge.

On these amorphous silicon laminate layers are formed the transparent electroconductive electrodes which constitute pairs with corresponding back electrodes. The electroconductive electrodes must be transparent to incident light such as sunlight. Such transparent electroconductive electrodes can be formed from a conventionally used material such as $In_2O_3$—$SnO_2$ film, $In_2O_3$ film, $SnO_2$ film and the like. The thickness of this electrode film is usually from 500 to 800Å. These transparent electroconductive electrodes are further covered with a $SiO_2$ film 6.

In the case where incident light such as sunlight enters through a transparent substrate and transparent electrodes, the amorphous silicon solar battery of this invention has a structure such as shown in FIGS. 3 and 4.

In FIG. 3, numeral 7 designates a transparent substrate, 5a–5e transparent electrodes, 4 amorphous silicon layers, 3a–3e back electrodes, and 8 an organic resin layer for passivation.

In the structure of FIG. 4, each separate back electrode, for example 3a comprises two layers $3a_1$ and $3a_2$. Layer $3a_1$ is a conventional back electrode forming layer (made of a metal such as Al or an alloy mentioned above) and the other layer $3a_2$ is a back electrode forming layer in accordance with this invention, which is made of at least one compound selected from Mt-Si, Mt-N and Mt-C compounds mentioned above. Other reference numbers signify the same features as in FIG. 3. L indicates incident light.

In this case, the substrate 7 must be transparent since the incident light enters through the substrate, so that, for instance, a light-transmissive glass plate is used as the substrate.

The materials and the methods for forming the transparent electrodes, amorphous silicon layers, and back electrodes are the same as described before.

The organic resin layer 8 can be formed by a conventional method by using, for example, an epoxy resin.

In this case, the surface of the back electrode which is in contact with said organic resin layer 8 must be formed of at least on compound selected from said Mt-Si, Mt-N, and Mt-C compounds. In the structure of FIG. 3, each separate back electrode, as indicated by 3a–3e, is entirely formed of such compound(s), and in the structure of FIG. 4, only a half portion of each separate back electrode, indicated by $3a_2$–$3e_2$, is formed with said compounds.

Hereinabove described are the embodiments of amorphous silicon solar battery having a structure such as shown in FIG. 2 and a structure such as shown in FIGS. 3 and 4. In either of these structures, extremely strong adhesion is provided between the back electrode and the other layers, especially the organic resin layer, and also the degradation of the battery due to moisture absorption of the organic resin layer is surprisingly lessened even when the battery is used for a long time. The solar battery of this invention is also very advantageous in its practical applications as a desired high output voltage can be obtained by connecting pairs of electrodes in series, sandwiching amorphous silicon layers therebetween, on the same substrate. Further, since at least a major surface of the back electrode placed opposite to the corresponding transparent electrode passing incident light, which surface is in contact with the organic resin layer, is formed of at least one compound selected from the group consisting of a compound of a transition metal and silicon, a compound of a transition metal and carbon, and a compound of a transition metal and nitrogen compounds, there is eliminated any risk of corrosion, peeling, and other troubles of said electrode and also the decline of output with the lapse of time is diminished. Thus, in accordance with this invention, there is provided an amorphous silicon solar battery with high reliability, high quality and high performance.

The present invention will be illustrated in further detail hereinbelow by way of Examples thereof.

EXAMPLE 1

Figure 1:
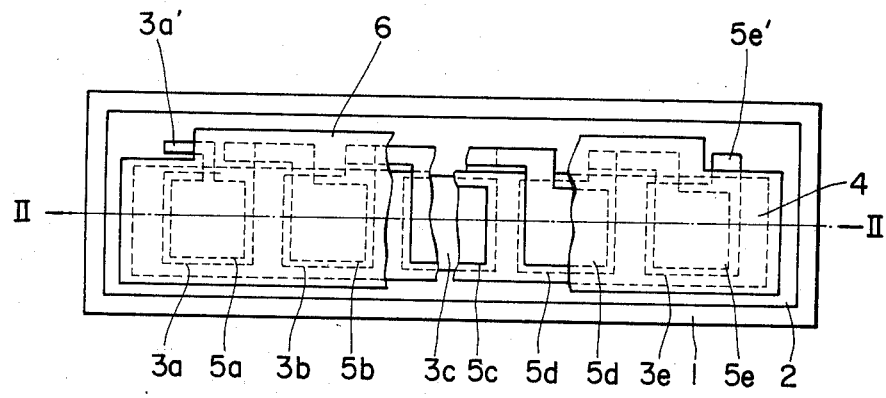
FIG. 1 is a plan view, with parts cut out, of an embodiment of amorphous silicon solar battery according to this invention.

A plurality of amorphous silicon solar batteries of the structure shown in FIGS. 1 and 2 were produced.

A 0.1 mm thick film 1 of stainless steel (SUS 304 according to JIS Standard) was used as the substrate, and on the surface of this stainless steel film 1 was formed an about 5 μm thick heat-resistant resin layer 2 made of polyimideisoindoloquinazolinedione. The heat-resistant resin layer 2 was formed by coating said resin uniformly on the substrate with a roll coater and drying the coating by heating at about 300° C. On the substrate 1 coated with said heat-resistant resin layer 2, there were further formed the film type back electrodes 3a–3e with a thickness of approximately 2,000 Å by sputtering molybdenum silicide ($MoSi_2$) as a transition metal-silicon compound, said back electrodes being spaced apart from each other at a predetermined interval. Then, with the substrate temperature maintained at about 250°, amorphous silicon was coated by a plasma CVD method on the heat-resistant resin layer 2 with said back electrodes 3a–3e to form amorphous silicon layers 4 consisting of P type, intrinsic and N type layers in this order with thicknesses of about 300 Å, 5,000 Å and 150 Å, respectively. $In_2O_3$-$SnO_2$ was deposited on this amorphous silicon laminate 4 by sputtering to form a series of film type transparent electroconductive electrodes 5a–5e, each having a thickness of about 800 Å, so that these transparent electroconductive electrodes were positioned opposite the corresponding back electrodes 3a–3e while extending over an end of each of the adjoining back electrodes. Finally, $SiO_2$ was coated on said transparent electrodes 5a–5e by means of sputtering to form an about 2,000 Å thick $SiO_2$ film 6 intended for the twin purposes of passivation and reflection prevention, thereby completing an amorphous silicon solar battery assembly comprising five series-connected cells. The connections of the five unit solar cells were made simultaneously with the formation of the electrode pattern of the transparent electrodes 5a–5e. At an end of the back electrode 3a and at an end of the transparent electrode 5e were formed the terminals 3a' and 5e', respectively, for providing output terminals. External light L enters in the direction of the arrow. The thus constructed amorphous silicon solar battery showed excellent initial properties.

In a moisture resistance test conducted by maintaining the battery under irradiation of 1,000 lux white fluorescent light at a temperature of 70° C. and a relative humidity of 95% for a period of 1,000 hours, there was observed little deterioration of properties such as photoelectric conversion efficiency.

EXAMPLE 2

An amorphous silicon solar battery was produced in the same way as Example 1 except that Mo—Si (1:1 by mole) was used in place of $MoSi_2$. The obtained solar battery showed the same properties as the product of Example 1.

When $WSi_2$, $TaSi_2$, $TiSi_2$, or TiSi was used in place of $MoSi_2$ in Example 1, the obtained solar batteries all showed the same excellent properties as the product of Example 1.

COMPARATIVE EXAMPLE 1

An amorphous silicon solar battery was produced in the same way as Example 1 except for stainless steel (18 Cr-8 Ni) was used instead of $MoSi_2$.

When the obtained solar battery was subjected to the moisture resistance test, the photoelectric conversion efficiency lowered by about 5% and the edges of the back electrode peeled off partly.

COMPARATIVE EXAMPLE 2

An amorphous silicon solar battery was produced by the same process as Example 1 except for stainless steel (13 Cr) was used instead of $MoSi_2$.

When the moisture resistance test was conducted on this solar battery, the photoelectric conversion efficiency deteriorated by 10–50% and the edges of the back electrode were corroded thereby causing partial peel-off.

EXAMPLE 3

A solar battery was produced in the same way as Example 1 except that the back electrode was formed with ZrC (1:1 by mole) by sputtering. This solar battery had the same properties as the product of Example 1.

EXAMPLE 4

An amorphous silicon solar battery of the structure shown in FIG. 3 was produced.

A 1.0 mm thick light-transmissive glass plate was used as the substrate 7, and on this substrate were formed the transparent electroconductive electrodes 5a–5e made of $In_2O_3$—$SnO_2$. Further formed thereon were the p-i-n three silicon layers in the same manner as Example 1, but the thickness is of the p, i, n layers were 150 Å, 5,000 Å and 300 Å, respectively, followed by back electrodes 3a–3e formed thereon by sputtering of molybdenum silicide ($MoSi_2$). Further, an epoxy resin layer was formed for the purpose of passivation on the amorphous silicon laminate 4 containing said back electrodes 3a–3e.

the obtained amorphous silicon solar battery showed the same excellent properties as the product of Example 1.

EXAMPLE 5

An amorphous silicon solar battery of the structure shown in FIG. 4 was made in the same way as Example 3 except that each of the back electrodes was formed from two layers: an Al layer $3a_1$–$3e_1$ and an $MoSi_2$ layer $3a_2$–$3e_2$ (each layer being about 1,000 Å thick).

The obtained amorphous silicon solar battery showed the same excellent properties as the product of Example 1.

What is claimed is:

1. An amorphous silicon solar battery comprising a substrate and formed thereon at least one pair of opposed light incident transparent electroconductive and back electrodes sandwiching an amorphous silicon layer, at least a major surface of said back electrode being in contact with an organic resin layer and being made of at least one member selected from the group consisting of a compound of at least one transition metal and silicon, a compound of at least one transition metal and nitrogen, and a compound of at least one transition metal and carbon.

2. A solar battery according to claim 1, wherein the transition metal in the compound of at least one transition metal and silicon is at least one member selected from the group consisting of Ti, Zr, Hf, V, Nb, Ta, Cr, Mo, W, Re, Fe, Co, Ni, Pt, and Pd.

3. A solar battery according to claim 2, wherein the transition metal is at least one member selected from the group consisting of Ti, Zr, Hf, Ta, Mo, and W.

4. A solar battery according to claim 2, wherein the content of silicon is 20 to 80% by mole.

5. A solar battery according to claim 1, wherein the transition metal in the compound of at least one transition metal and nitrogen is at least one member selected from the group consisting of Ti, Zr, Hf, V, Nb, Ta, Mo, and W.

6. A solar battery according to claim 5, wherein the content of nitrogen is 5 to 60% by mole.

7. A solar battery according to claim 1, wherein the transition metal in the compound of at least one transition metal and carbon is at least one member selected from the group consisting of Ti, Zr, Hf, V, Nb, Ta, Mo, and W.

8. A solar battery according to claim 7, wherein the content of carbon is 5 to 70% by mole.

9. A solar battery according to claim 1, wherein the substrate is a light-transmissive insulating glass plate on which said transparent electroconductive electrode is formed and the organic resin layer in contact with the back electrode is an epoxy resin layer for passivation.

10. A solar battery according to claim 9, wherein the back electrode has a laminate structure in which the major surface layer in contact with the organic resin layer is made of at least one member selected from the group consisting of a compound of at least one transition metal and silicon, a compound of at least one transition metal and nitrogen, and a compound of at least one transition metal and carbon.

11. A solar battery according to claim 1, wherein the substrate is a flexible metal plate coated with a heat resistant organic resin layer and the back electrode is formed on said heat resistant resin layer.

12. A solar battery according to claim 11, wherein the back electrode has a laminate structure in which the major surface layer in contact with the heat resistant resin layer is made of at least one member selected from the group consisting of a compound of at least one transition metal and silicon, a compound of at least one transition metal and nitrogen, and a compound of at least one transition metal and carbon.

13. A solar battery according to claim 1, wherein a plurality of unit cells each comprising a back electrode, a transparent electroconductive electrode, and an amorphous silicon layer sandwiched therebetween, with amorphous silicon arranged between adjacent unit cells, whereby said unit cells are formed on said substrate and connected in series.

14. A solar battery according to claim 13, wherein at least a major surface of the back electrode contacting the organic resin layer is made of $MoSi_2$, MoSi, $TiSi_2$, $ZrSi_2$, $WSi_2$, TiSi, $TaSi_2$, or $HfSi_2$.

15. A solar battery according to claim 13, wherein the back electrode has a laminate structure in which the major surface layer in contact with the organic resin layer is made of at least one member selected from the group consisting of a compound of at least one transition metal and silicon, a compound of at least one transition metal and nitrogen, and a compound of at least one transition metal and carbon.

* * * * *